United States Patent
Patel et al.

(10) Patent No.: US 11,195,575 B1
(45) Date of Patent: Dec. 7, 2021

(54) MEMORY ARRAY WITH SHORTING STRUCTURE ON A DUMMY ARRAY THEREOF, AND METHOD OF PROVIDING SAME

(71) Applicant: Intel Corporation, Santa Clara, CA (US)

(72) Inventors: Jaydip Bharatkumar Patel, Folsom, CA (US); Everardo Flores, III, Folsom, CA (US); Khaled Hasnat, San Jose, CA (US); Max F. Hineman, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/946,527

(22) Filed: Jun. 25, 2020

(51) Int. Cl.
| | |
|---|---|
| *G11C 11/4099* | (2006.01) |
| *G11C 11/4094* | (2006.01) |
| *G11C 11/4074* | (2006.01) |
| *G11C 11/408* | (2006.01) |
| *G11C 5/02* | (2006.01) |

(52) U.S. Cl.
CPC .......... *G11C 11/4099* (2013.01); *G11C 5/025* (2013.01); *G11C 11/4074* (2013.01); *G11C 11/4085* (2013.01); *G11C 11/4094* (2013.01)

(58) Field of Classification Search
CPC ............ G11C 11/4099; G11C 11/4094; G11C 11/4074; G11C 5/025; G11C 11/4085
See application file for complete search history.

(56) References Cited

U.S. PATENT DOCUMENTS

| | | | |
|---|---|---|---|
| 9,455,267 B2 * | 9/2016 | Zhang | G11C 16/0483 |
| 9,627,440 B2 * | 4/2017 | Russo | H01L 45/141 |
| 10,224,373 B2 * | 3/2019 | Sel | H01L 45/1253 |
| 2009/0073796 A1 | 3/2009 | Ahsan et al. | |
| 2009/0231899 A1 | 9/2009 | Park | |
| 2013/0099298 A1 * | 4/2013 | Kim | H01L 29/42356 |
| | | | 257/296 |
| 2015/0261617 A1 | 9/2015 | Choi et al. | |
| 2018/0151200 A1 | 5/2018 | Miyazaki | |
| 2019/0102088 A1 | 4/2019 | Fang et al. | |
| 2019/0103440 A1 | 4/2019 | Inaba et al. | |
| 2020/0091240 A1 | 3/2020 | Hong | |

OTHER PUBLICATIONS

EPO; Extended European Search Report issued in EP Patent Application No. 20208276.4, dated Apr. 23, 2021; 9 pages.

* cited by examiner

*Primary Examiner* — Tri M Hoang
(74) *Attorney, Agent, or Firm* — Alliance IP, LLC

(57) ABSTRACT

A method, memory device and system. The memory device includes an active memory array including memory cells and address lines, the address lines including bitlines (BLs) and wordlines (WLs), each of the memory cells connected between one of the BLs and one of the WLs; a dummy array including dummy address lines, the dummy address lines including dummy BLs and dummy WLs; at least one shorting structure extending across and in electrical contact with at least some of the dummy address lines to electrically short the at least some of the dummy address lines together; and at least one contact structure extending from the dummy array and electrically coupled to the at least some of the dummy address lines to connect the at least some of the dummy address lines to a predetermined voltage.

19 Claims, 8 Drawing Sheets

MEMORY ARRAY WITH SHORTING STRUCTURE ON A DUMMY ARRAY THEREOF, AND METHOD OF PROVIDING SAME

FIELD

The present disclosure relates in general to the field of computer development, and more specifically, to reducing the die size of three-dimensional (3D) crosspoint memory devices.

BACKGROUND

A storage device may include non-volatile memory, such as multi-stack three dimensional (3D) crosspoint memory devices including stacks of memory arrays. Mechanisms are needed to ensure small die sizes for memory chips including memory arrays, especially in light of the need to save space for control circuitry in substrate structures supporting the stacks of memory arrays.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
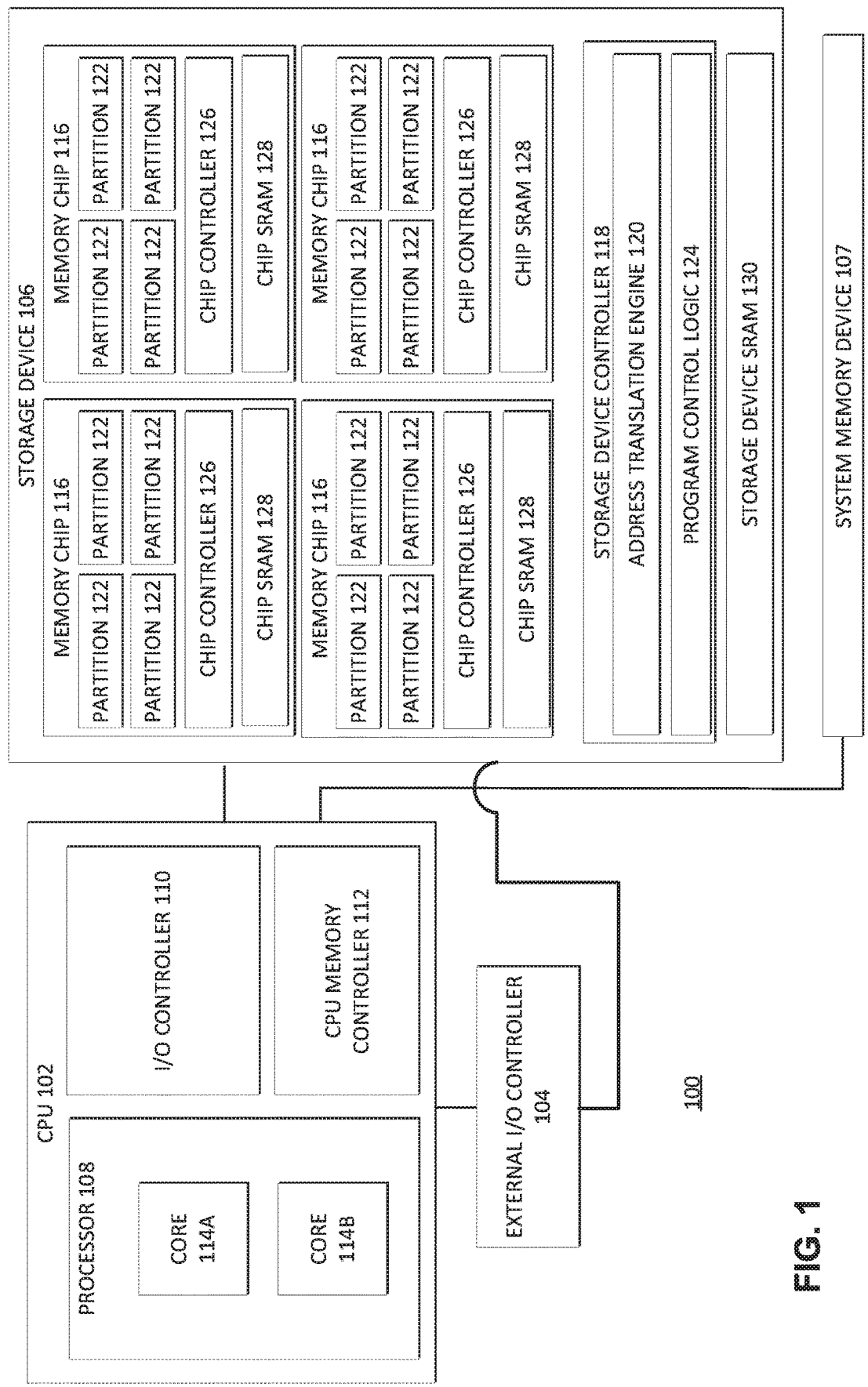
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition may include a 3D crosspoint memory device. In some embodiments, a 3D crosspoint memory device may comprise a transistor-less (i.e., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a DSP, a network processor, a handheld processor, an application processor, a co-processor, an SOC, or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that maintains its state even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory module may include non-volatile memory and/or volatile memory.

Non-volatile memory is a storage medium that does not require power to maintain the state of data stored by the medium. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, stacks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory devices. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to the memory chips 116, and provide data associated with the requests to CPU 102 (e.g., via CPU memory controller 112 or I/O controller 110). Controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM 130 and chip SRAM 128 each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM 130 (such as a NVM—not shown) such that the logic may be executed by the storage device controller 118 which will have access to the logic instructions by way of the associated SRAM 128. Similarly, the logic to be implemented by the chip controller 126, upon the issuance of a command, for example from the host or CPU 102 to execute the logic, may be moved from a memory storage the logic to the associated SRAM 128 (such as a NVM—not shown) such that the logic may be executed by the associated chip controller 126 which will have access to the logic instructions by way of the associated SRAM 128.

Figure 2:
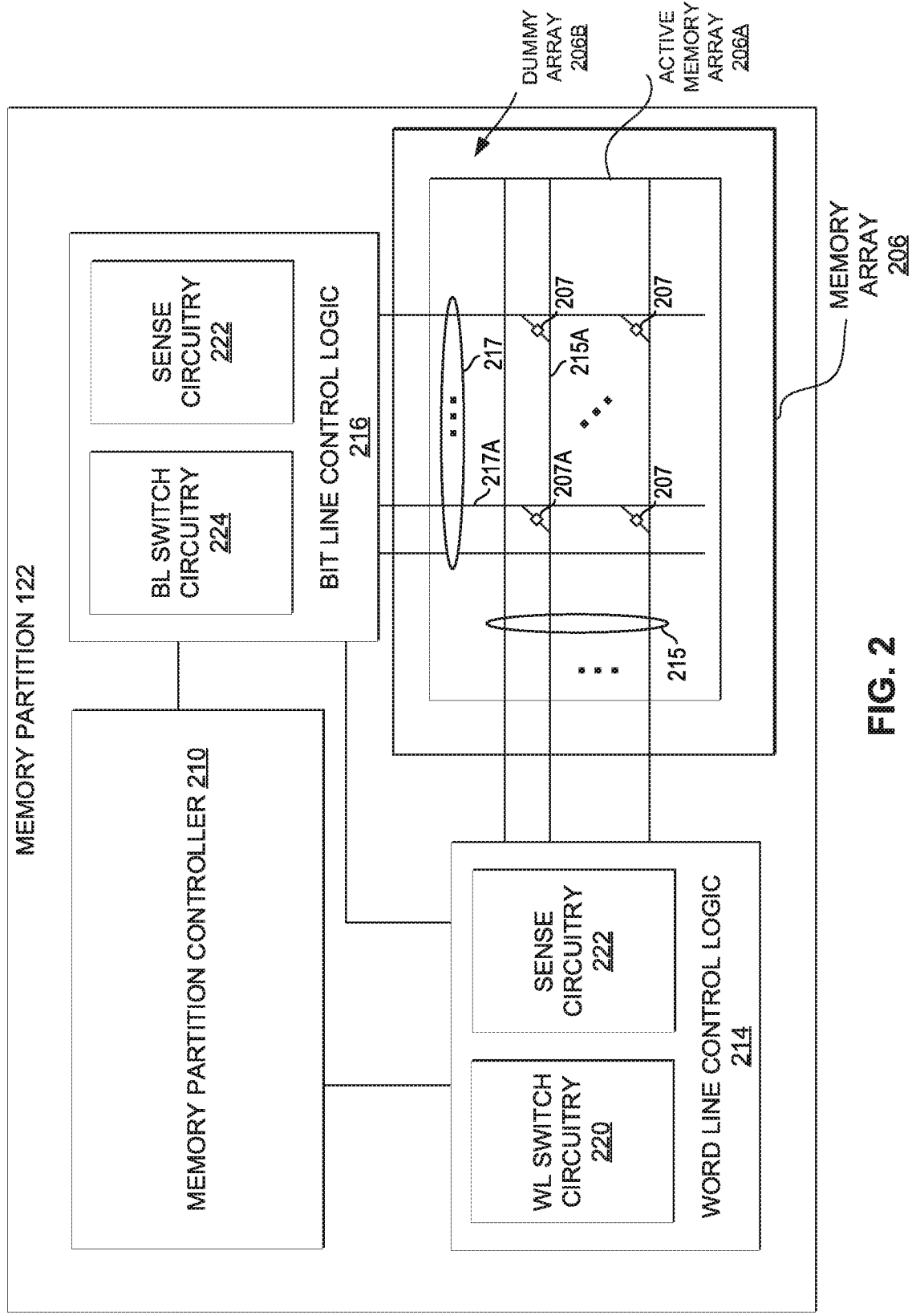
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, i.e., a select device coupled to the memory element. The select devices are configured to facilitate combining a plurality of memory elements into an array.

In some embodiments, a memory array 206 of a 3D crosspoint memory device may comprise a transistor-less (i.e., at least with respect to the data storage elements of the memory) stackable crosspoint architecture in which memory cells 207 sit at the intersection of row address lines and column address lines arranged in a grid. Thus, a 3D crosspoint memory device may include a number of stacks of memory arrays such as memory array 206 (noting that memory array 206 is a two-dimensional memory array which, when stacked, achieves the 3D crosspoint memory device structure referred to herein), with memory cells between alternating WLs and BLs from one end of the stack to the other end of the stack. The memory array 206 may include an active memory array 206A, and a dummy memory array section 206B. The memory cells 207, row address lines 215 and column address lines 217 are part of the active memory array 206A. The row address lines 215 and column address lines 217, called word lines (WLs) and bit lines (BLs), respectively, cross in the formation of the grid and each memory cell 207 is coupled between a WL and a BL where the WL and BL cross (i.e., crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory device may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

The dummy array 206B of memory array 206 includes dummy BLs and dummy WLs (shown in FIGS. 5 and 6 to be described further below) that are to be and remain grounded. The dummy BLs and dummy WLs of the dummy array 206B do not have a role in the addressing of the memory cells 207, while the BLs and WLS of the active memory array 206A do. It is to be noted that, in this instant description, a reference to a "bitline," "BL," "wordline" or "WL" is to refer to a BL or WL in the active memory array of a memory array, the a reference to "dummy bitline," "dummy BL," "dummy wordline" or "dummy WL" is to refer to a dummy BL or dummy WL in the dummy memory array section of a memory array. Dummy array 206B, although represented in the figures by a rectangular periphery section of active memory array 206A, may in practice have any shape. The dummy array 206B is an artifact of the photolithographic process used to create the BLs and the WLs, and, to the extent that the dummy BLs and the dummy WLs are not needed for the addressing of memory cells, they are typically grounded. In the instant description, the term "dummy" may be used to indicate a component having a structure and a shape the same as or similar to those of other components, but which is merely present as a pattern without being configured to perform one or more functions of the other components.

During a programming operation (i.e., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage (a demarcation read voltage (VDM)) across the memory element is configured to be greater than a maximum set voltage and less than a minimum reset voltage for the memory element.

In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the BL electrode of the 3D crosspoint cell may be a positive regulated node and the WL electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still see approximately ½ of VDM, with only cell 207A seeing the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes the active memory array 206A (including a plurality of word lines 215, a plurality of bit lines 217 and a plurality of memory cells, e.g., memory cells 207), and the dummy memory array section 206B (including dummy WLs and dummy BLs).

Each memory cell is coupled between a word line ("WL") and a bit line ("BL") at a crosspoint of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 206 may be configured to store binary data and may be written to (i.e., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to WL select bias voltage to select the respective WL 215A. For example, switch circuitry 220 may include a plurality of transistors.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select one or more target memory cells, e.g., memory cell 207A, for a read operation by coupling WL 215A to WL select bias voltage and BL 217A to BL select bias voltage. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a wordline (WL) load connected to a WL electrode or gate, and a bitline (BL) load connected to a BL electrode or gate. When a particular WL and BL are selected in the array, a different between WL load or WL voltage and the BL voltage correspond to a read VDM. VDM may induce a current in the memory cell 207A, icell. A comparator such as a sense amplifier may compare icell with a reference voltage in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation. In some embodiments, leakage components of the current can be mitigated by respectively selecting a bias for all other unselected WLs and BLs that reduces or minimizes leakage. Capacitive components of the current can be mitigated by allowing sufficient time for the capacitive components to dissipate.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
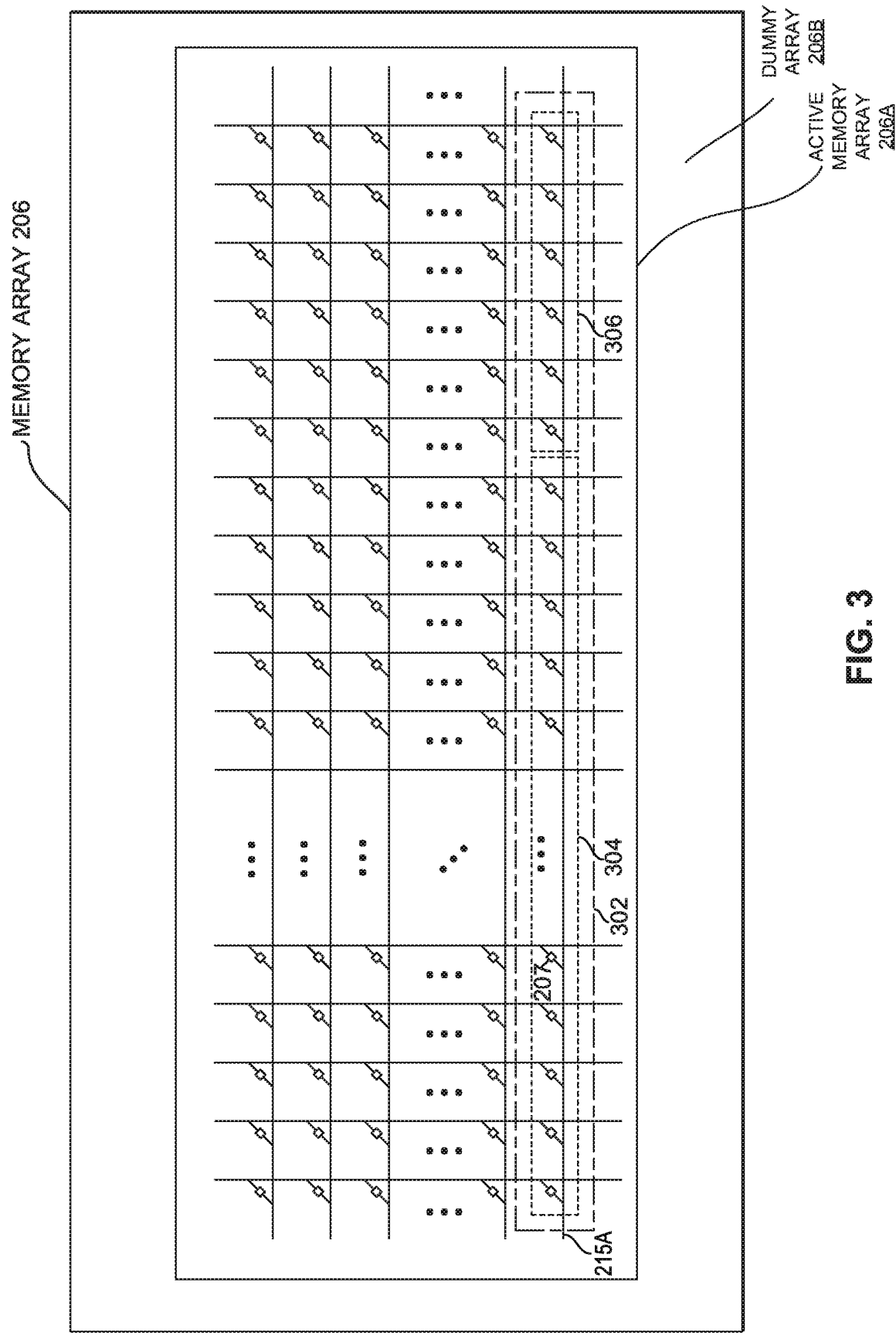
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers 210.

Figure 4:
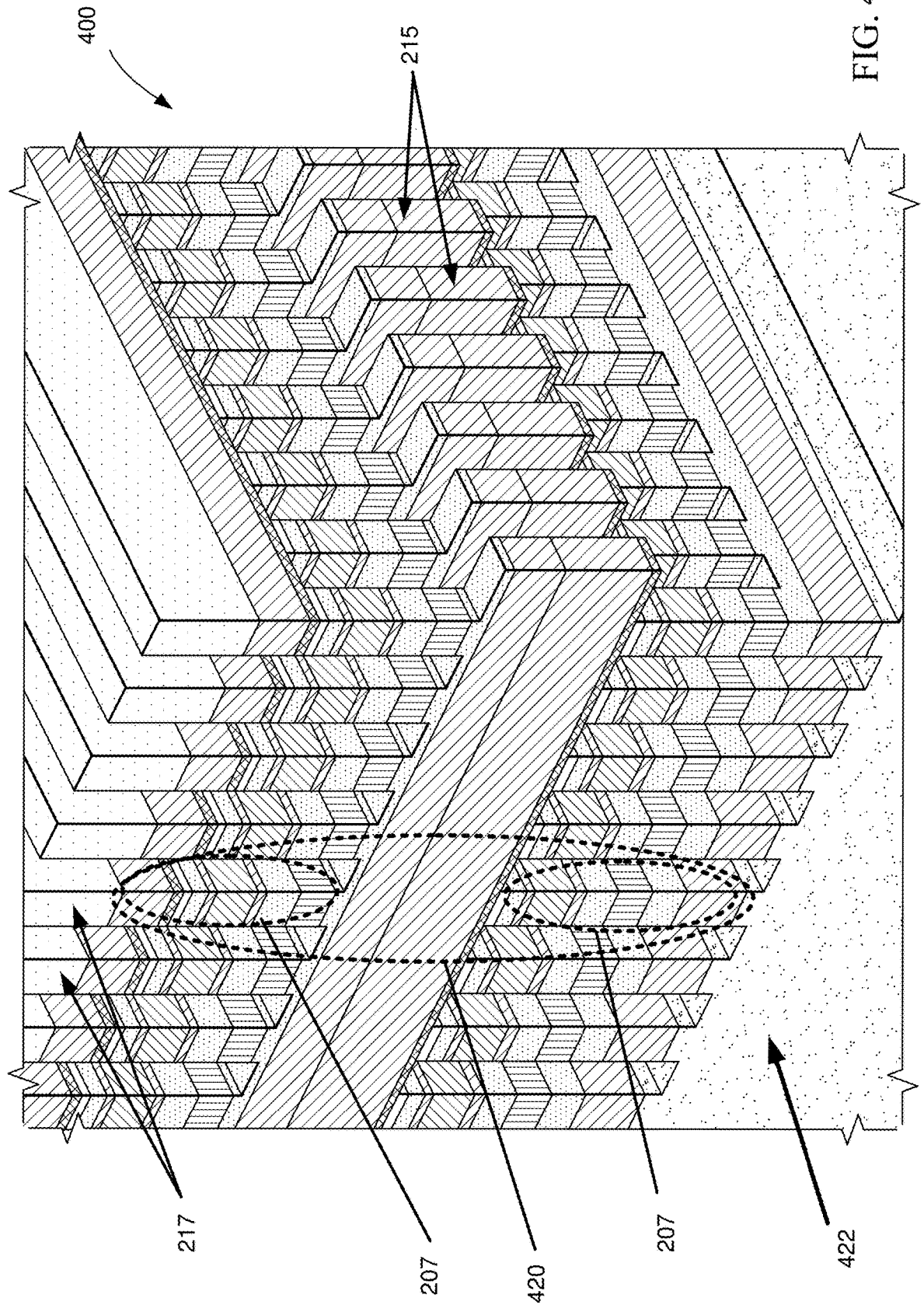
FIG. 4 is a perspective view of portions of a 3D crosspoint memory stack according to one embodiment.

FIG. 4 is a perspective diagram of an example of a portion of stack 400 of a 3D crosspoint memory device including memory arrays such as those of FIGS. 2 and 3. Stack 400 provides an example of a circuit in accordance with array 206 of FIGS. 6 and 7. The specific layers are merely examples, and will not be described in detail here. Stack 400 is built on substrate structure 422, such as silicon or other semiconductor. Stack 400 includes multiple pillars 420 as memory cell stacks of memory cells 207. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. More generically, WLs and BLs can be referred to as "address lines", referring to signal lines used to address memory cells. Different architectures can use different numbers of stacks of devices, and different configuration of WLs and BLs. It will be understood that the space between pillars 420 is typically an insulator. In one example, stack 400 the BL and WL are made of tungsten metal.

At least some of WLs 215 may correspond to WLs 215 of FIG. 2. At least some of the BLs 217 may correspond to BLs 217 of FIG. 2. Substrate structure 422, such as a silicon substrate, may include control circuitry therein (not shown), such as control circuitry including transistors, row decoders, page buffers, etc. Memory cells 207 may correspond to memory cells 207 of FIG. 2. The control circuitry of substrate structure 422 may include, for example, a memory partition controller such as memory partition controller 210, BL control logic such as BL control logic 216, and WL control logic such as WL control logic 214 of FIG. 2. Each row of WLs 215 extending in the Y direction, the corresponding cells as coupled to corresponding BLs, would define a memory array, and may correspond to a memory array such as memory array 206 of FIGS. 2 and 3. Some of the WLs and some of the BLs may include dummy WLs or dummy BLs (not shown in FIG. 4), corresponding to the dummy WLs and dummy BLs in the dummy array 206B of FIGS. 2 and 3.

Figure 5:
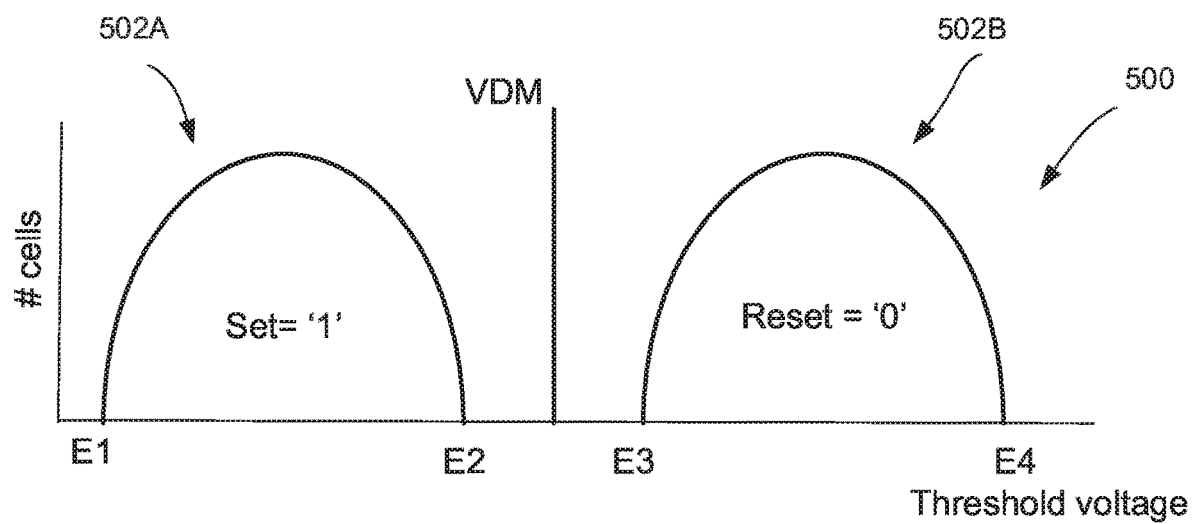
FIG. 5 is a graph depicting memory cell threshold voltage distributions and demarcation voltages in accordance with certain embodiments for a single level cell memory.

FIG. 5 illustrates a plot or graph 500 depicting memory cell threshold voltage statistical distributions 502A for set cells (storing a bit 1) (storing a bit 0), and 502B for reset cells (these are meant to represent bell curves for example), an ideal read voltage "ideal VDM" and an unintended read voltage "unintended VDM".

In FIG. 5, the horizontal axis depicts threshold voltages of memory cells of a single level cell array and the vertical axis depicts bit counts (i.e., number of memory cells). Thus, each point of a distribution 502A/502B represents a number of cells having a particular threshold voltage. The graph 500 assumes that half of the bits of the array are in a set state (i.e., have a threshold voltage lower than the corresponding VDM) and half of the bits are in a reset state (i.e., have a threshold voltage higher than the corresponding VDM). Distributions 502A and 502B represents a baseline distribution that may correspond to a threshold voltage distribution at a particular point in time.

In a read operation, a target memory cell, such as cell 207A, is selected via the application of a first bias voltage to the WL 215A and a second bias voltage to the BL 217A that cross at the target memory cell for a time interval. A resulting differential bias voltage (a demarcation read voltage (VDM)) across the memory element is configured to be greater than a maximum set voltage E2 and less than a minimum reset voltage E3 for the memory element.

In response to application of the VDM, the target cell may or may not snap back, depending on whether the target cell is in the crystalline state (set) or the amorphous state (reset), as suggested in FIG. 5. If the target cell is in a set state, application of the VDM would cause the set cell to snap back, in which case the target cell would be read as a logic one, and if the target cell is in a reset state, application of the VDM, ideally, would not cause the reset cell to snap back, in which case the target cell would be read as a logic zero. Sense circuitry, coupled to the memory cell, is configured to detect the presence or absence of snap back in a sensing time interval. The presence of snap back may then be interpreted as a logic one and the absence of snap back as a logic zero as noted above.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell as shown in FIG. 5, the memory cell may be sensed as storing a logic one and when the VDM is lower than the threshold voltage of the memory cell, the memory cell may be sensed as storing a logic zero.

Embodiments provide for improved memory array efficiency in using the space between memory array stacks, such as stack 400 of FIG. 4, and its associated supporting substate structure, such as substrate structure 422, in back end of line (BEOL) memories. The BEOL is the second portion of IC fabrication where the individual devices, such as transistors, capacitors, resistors, etc., are interconnected with wiring on a wafer by way of metallization layers. BEOL include the provision of contacts, insulating layers such as dielectrics, metal levels, and bonding sites for chip-to-package connections.

Memory die size has been impacted by the lack of space for transistor and interconnect routing under the memory array stacks in the associated substrate structure. As design rule targets aim for memory chips with smaller footprints, the space required for the routing of contact structures to lower control circuitry of the 3D crosspoint stack for biasing would encroach upon the space needed for the control circuitry within the supporting substrate. The current state of the art typically provides one array via per dummy BL or WL at each memory array, such as at each memory array 206, where each of the array vias includes a dedicated (i.e. its own) contact structure to corresponding bias circuits of the control circuitry of in the corresponding supporting substrate in order to bias each of the array vias, and hence the associated dummy BLs and WLs, to ground. Dummy BLs and WLs need to be biased, not floated, as appropriate while operating active decks in a stack. Because of the above, the state of the art connects the dummy WLs and BLs to individual/dedicated bias circuits as with BLs and WLs of the live/active memory array. The above practice takes up space unnecessarily, both between the dummy BLs and WLs and the substrate structure, and, importantly on the substrate structure, taking up space, driving up die size and therefore die cost.

However, this additional space required for the routing of dummy BL and dummy WL array contact structures would require a reduction of design rule target dimensions for the control circuitry typically provided under the stack of memory arrays, that is, under the stacks of memory array blocks. The design rule target reduction would in turn counter the cost decrease associated with a reduction of the die size by adding the cost of more advanced processing requirements, such as with respect to tooling or process recipes.

Embodiments are directed to a device, system and method that provide for an electrical shorting of dummy BLs and/or dummy WLs of a dummy array of a memory array, such as dummy array 206B of memory array 206, in this way advantageously reducing the number of contact structures necessary to bias the dummy BLs and/or dummy WLs as compared with the prior art. According to a preferred embodiment, the shorting may involve a shorting of all dummy BLs and/or all dummy WLs of a dummy array of a memory array, in this manner advantageously allowing fewer bias circuits of the control circuitry of the corresponding substrate structure, and, importantly, allowing a single contact structure per memory array per shorted dummy BLs and/or per shorted dummy WLs. One embodiment includes a single contact structure or contact structure for dummy BLs of a given memory array, and/or a single contact structure for dummy WLs of a given memory array, the single contact structure to bias the dummy BLs/dummy WLs to ground. Some embodiments further provide a unique stepwise layout of the array vias to cause an improved processing margin for a shorting scheme of a dummy edge section of a memory array. Some embodiments advantageously result in die size reduction of about 3% as compared with instances where the dummy BLs and dummy WLs of dummy arrays of a memory device are individually biased to ground by way of dedicated contact structures.

Some embodiments provide for shorting structures extending across and in electrical contact with at least some of the dummy BLs and/or at least some of the dummy WLs of a dummy array of a memory array. Any number of the shorting structures for a given dummy array may be connected to one another to propagate the shorting across a larger number of the dummy BLs and/or dummy WLs of the given array. One or more contact structures may be provided to connect a corresponding one or more of the shorting structures of the given dummy array to the control circuitry of a memory chip including the memory array. The above architecture may be provided on all or some of the memory arrays of stack of memory arrays, and the through vias may short the dummy arrays to one another and to ground, or the contact structures may extend from each dummy array of each memory array to ground.

Figure 6:
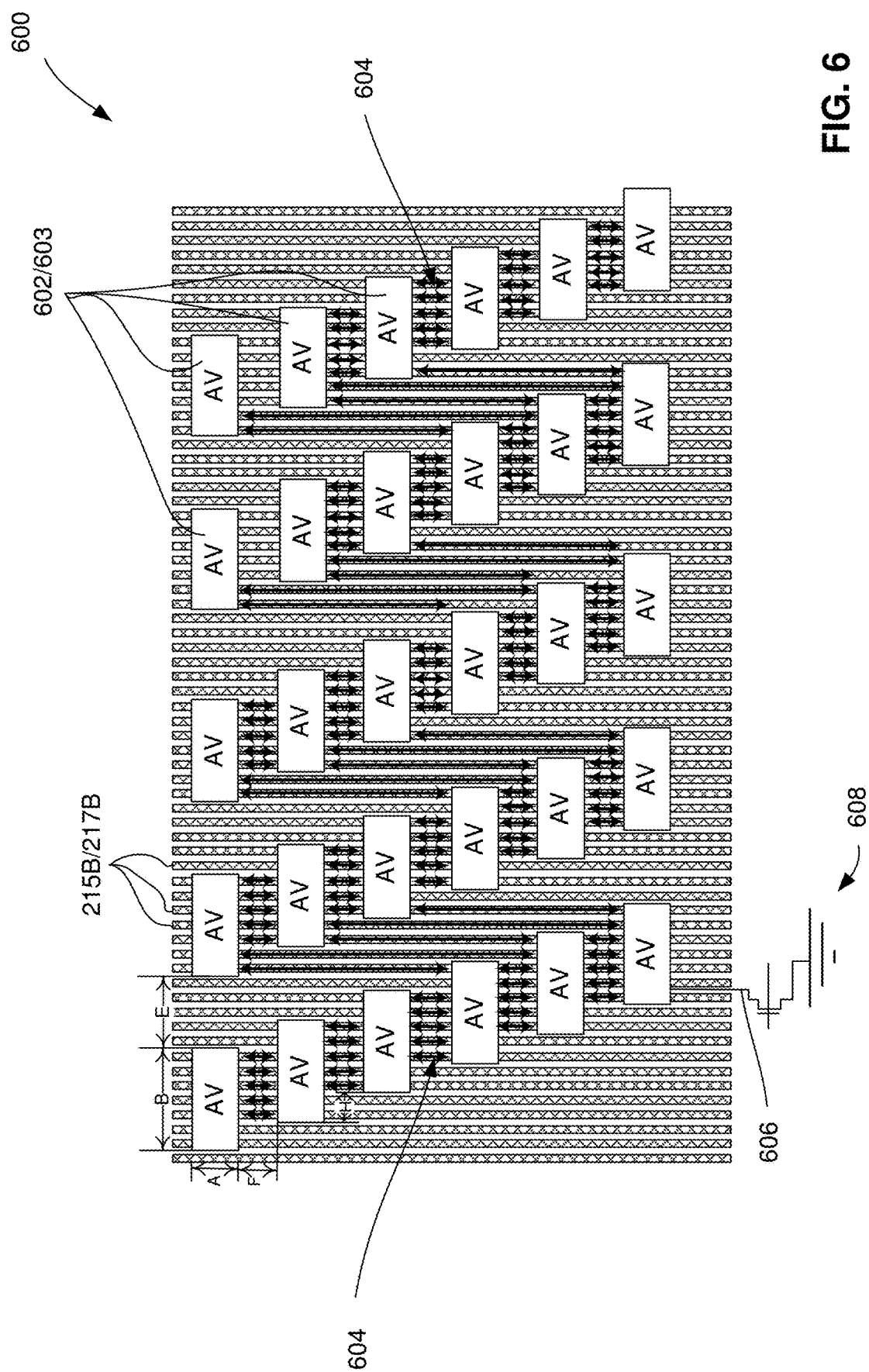
FIG. 6 is a top plan view of a portion of the dummy edge section of the memory array of FIGS. 2 and 3 including array vias according to one embodiment.
Figure 7:
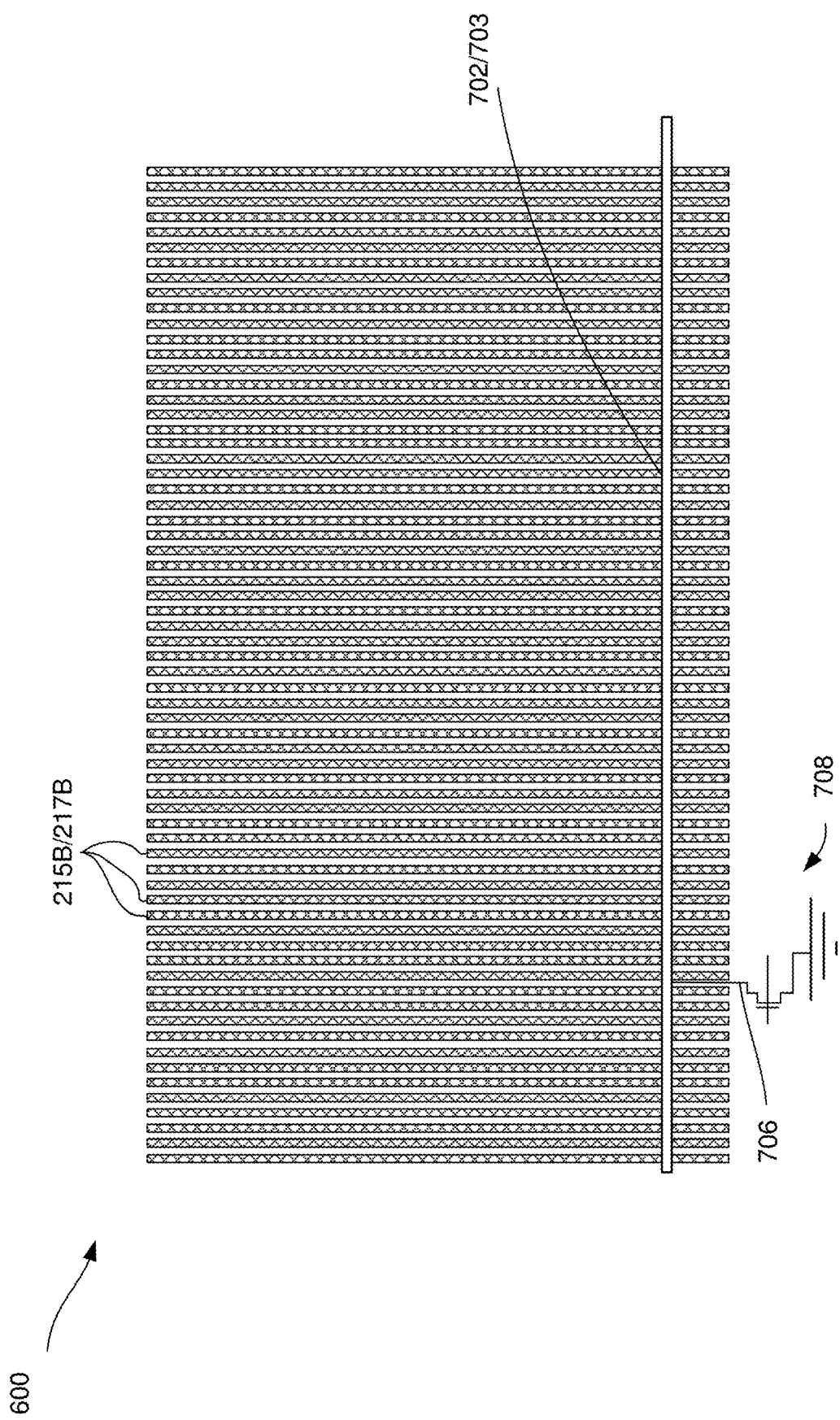
FIG. 7 is a top plan view similar to FIG. 5 of a portion of the dummy edge section of the memory array of FIGS. 2 and 3, including a shorting structure according to another embodiment.

Reference is now made to FIG. 6, which shows a portion 600 of the dummy array 206B of FIG. 2 or FIG. 3. Portion 600 includes a series of dummy BLs/dummy WLs 215B/217B, and a set of shorting structures 602. By referring to "dummy BLs/dummy WLs," what is meant herein, for example in the context of FIGS. 6 and 7, is that the shown vertically extending lines in those figures are meant to depict either the dummy BLs or the dummy WLs. A shorting structure 602 extends across and is in contact with a number X of the dummy BLs/dummy WLs 215B/217B and is surrounded by a dielectric material (not shown) that covers the dummy BLs/dummy WLs. In the embodiment of FIG. 6, the shorting structures 602 correspond to array vias 603 that may be provided by way of a photolithographic process. In FIG. 6, all of the shorting structures 602 are identical, but embodiments are not so limited, and include within their scope the provision of one or more shorting structures, where, if a plurality of shorting structures are provided, those shorting structure are either identical to one another or different from one another with respect to size, shape, material and/or manner of shorting dummy BLs/dummy WLs. The particular embodiment of FIG. 6 shows identical array vias that are disposed with their lengths B extending across a number X dummy BLs/dummy WLs being shorted, with X, in the shown embodiment of FIG. 6, being equal to 7, although X may be any number between 2 and all of the dummy BLs/dummy WLs of the dummy array 206B. Array vias may be provided by way of a photolithographic etching process involving etching a dielectric layer to form array via recesses, filling the etched array via recesses in the dielectric material with a metal/conductive material, and polishing the conductive material to obtain the array vias. The array vias may be spaced from one another at a distance F in a lengthwise direction of the dummy BLs/dummy WLs, and at a distance E in a widthwise direction of the dummy BLs/dummy WLs. Each array via 603 may have a width A chosen to balance process variations for the photolithographic process, and the smallest possible vias may be chosen for etching purposes, noting that increasing width A may impact etching accuracy more significantly than increasing length B. The size of each array via, its shape, and the distances E and F may be chosen based on process variations.

The array vias according to embodiments may be formed at the same time as the formation of regular connecting vias in a memory array using a standard etch/standard damascene process where a dielectric is etched, filled with a conductive material such as a metal, and then polished as noted above. One advantage of the daisy-chain shorting pattern formed by the array vias, such as array vias 603 of the embodiment of FIG. 6, is that such a pattern facilitates photolithography and etch of the array vias at the same time as other vias of the memory array are being provided also through a photolithography and etch process. The size, shape, and layout of the array vias, including for example width B, length A, lengthwise distance F or widthwise distance E between array vias, may be optimized to improve the efficiency of the shorting or amount of area consumed for the array vias. Parameters for optimization may include, for example, patterning process margin, etch sensitivity to a given feature size and shape, and/or lowest resistance path.

Shorting according to embodiments may be accomplished during array processing, that is, during a processing of array vias used to short dummy BLs/dummy WLs to the corresponding bias circuits in the supporting substrate. As noted previously, the shorting may aim to consume space in the routing layers of the supporting substrate of stacks of memory arrays. To accomplish the above without adding additional processing, and without degrading process margin, some embodiments provide a shorting structure using available layers (dummy BLs/dummy WLs and array vias therein) and without modifying the live array process architecture.

The above may be accomplished by modifying via structures which normally connect individual dummy WLs and BLs to their associated bias circuits or drive devices in the associated supporting substrate. As shown by way of the example in FIG. 6, according to one embodiment, such as modification may create a daisy-chain 604 of shorted dummy BLs/dummy WLs 215B/217B to enable the entire patch of the dummy array of a memory array to be connected via a single contact structure 606 to a single bias circuit or drive device 608 of the supporting substrate (not shown in FIG. 6) to bias the daisy-chain to ground and in this way minimize the used routing area. However, embodiments encompass an example where array vias, such as array vias 603, are connected to one another in more than one cluster, with each cluster being electrically isolated from other clusters, and with each cluster being connected to a bias circuit of the supporting substrate by way of a dedicated contact structure. The bias circuit to bias the array vias to ground may be any suitable bias circuit, such as one that includes one or more transistors.

FIG. 7 is similar to FIG. 6, with like reference numerals pointing to like features, and shows a portion 600 of the dummy array 206B of FIG. 2 or FIG. 3. Portion 600 includes a series of dummy BLs/dummy WLs 215B/217B, and a shorting structure 702. Shorting structure 702 extends across and is in contact with all of the dummy BLs/dummy WLs 215B/217B (not shown) and is surrounded by a dielectric material (not shown) that covers the dummy BLs/dummy WLs. In the embodiment of FIG. 7, the shorting structure 702 corresponds to a conductive line 703. According to an embodiment, conductive line 703 may be provided by way of a second photolithographic process using a second mask after a first mask is used in a first photolithographic process to provide the dummy BLs/dummy WLs, and before array vias are provided on the active memory array. The second photolithographic process may be a process similar to that used in the first photolithographic process to form the address lines. In FIG. 7, conductive line 703 is shown as being elongated and linear, although embodiments are not so limited, and include within their scope the provision of conductive line 703 or conductive lines 703 of any shape extending across all of the dummy BLs/dummy WLs of a dummy array of a memory array. The size of each conductive line, its shape and layout may be chosen based on process variations.

The conductive line according to embodiments may be formed at the same time as the formation of the BLs/WLs in a memory array using a standard metallization layer photolithographic process. According to one embodiment, a first mask may be used in a first photolithographic process to provide the BLs/WLs, followed by a second mask in a second photolithographic process to provide the conductive line(s). An advantage of the conductive line configuration, such as conductive line 703 of the embodiment of FIG. 7, is that it provides the possibility of shorting the dummy BLs/dummy WLs with a single shorting structure, in this way achieving a lower resistance path for shorting as compared with the provision of a plurality of array vias. The provision of a single elongated array via may not be as readily achievable using the standard photolithographic etch process typically used to provide array vias because of process limitations. The provision of a second mask and second photolithographic process therefore makes the provision of one or more elongated conductive lines possible. The size, shape, and layout of one or more conductive lines provided by way of a second photolithographic process as noted above using a second mask may be optimized based on photolithographic process margin, etch sensitivity to a given feature size and shape, and/or lowest resistance path.

Embodiments advantageously allow a reduction in the number of contact structures, and hence the number of bias circuits in the supporting substrate, that would be needed to connect dummy BLs/dummy WLs to ground in the supporting substrate of a memory array, in this way allowing a reduction in memory die size. Embodiments allow a reduction of the number of bias circuits to achieve biasing to ground by virtue of a shorting of dummy BLs/dummy WLs to one another.

Embodiments would bring about advantageous technical effects with respect to space saving on a memory die, for example on a multi-deck backend memory die having a quilted architecture.

Figure 8:
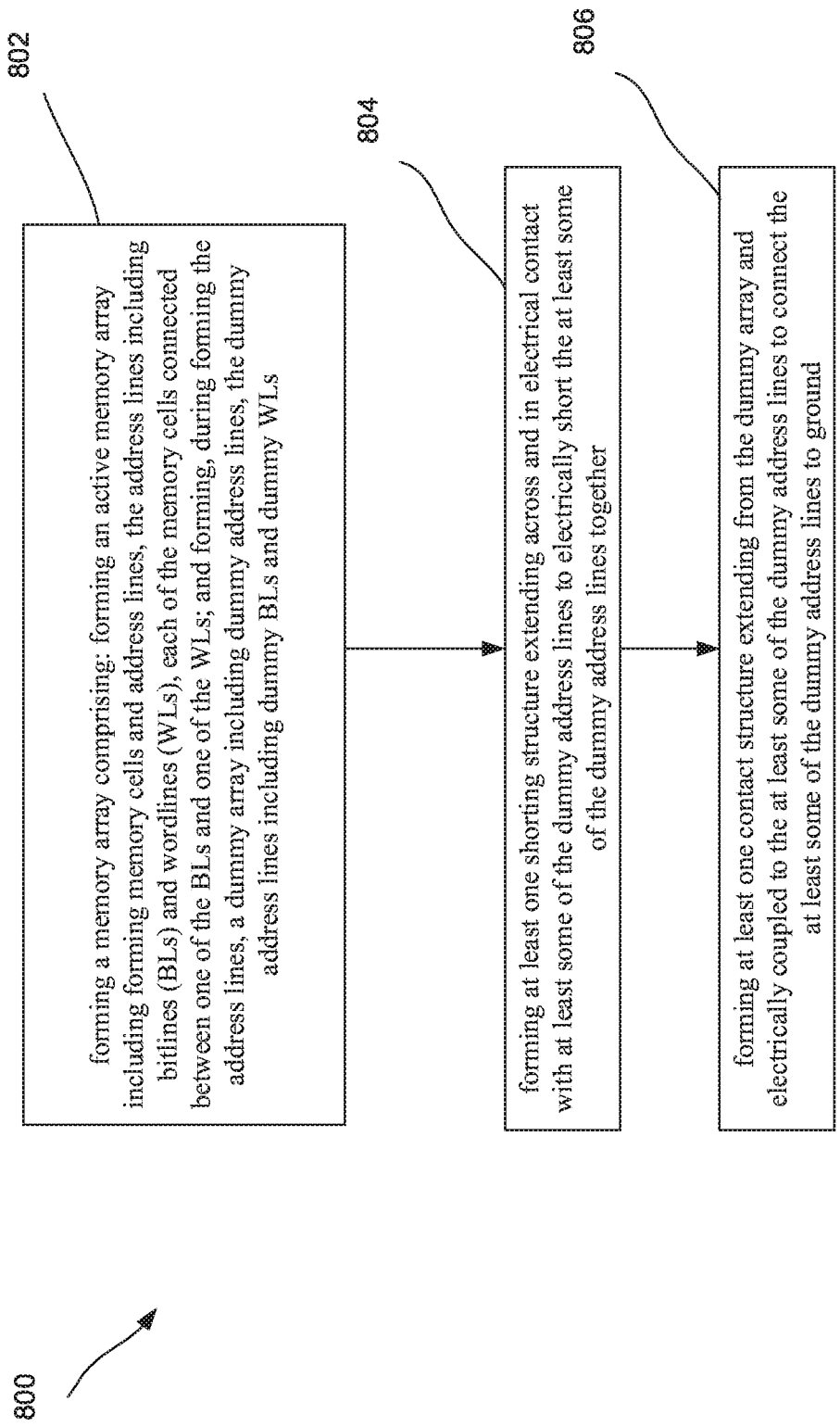
FIG. 8 illustrates an example process according to certain embodiments.

FIG. 8 illustrates an example of a process 800 according to some embodiments. The process includes, at operation 802, forming a memory array comprising forming an active memory array including forming memory cells and address lines, the address lines including bitlines (BLs) and wordlines (WLs), each of the memory cells connected between one of the BLs and one of the WLs; and forming, during forming the address lines, a dummy array including dummy address lines, the dummy address lines including dummy BLs and dummy WLs; at operation 804, forming at least one shorting structure extending across and in electrical contact with at least some of the dummy address lines to electrically short the at least some of the dummy address lines together; at operation 806, forming at least one contact structure extending from the dummy array and electrically coupled to the at least some of the dummy address lines to connect the at least some of the dummy address lines to a predetermined voltage. The predetermined voltage may correspond to ground.

The flow described in FIG. 8 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 8 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 306, memory partition controller 210, word line control logic 214, bit line control logic 216, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a memory device including: an active memory array including memory cells and address lines, the address lines including bitlines (BLs) and wordlines (WLs), each of the memory cells connected between one of the BLs and one of the WLs; a dummy array including dummy address lines, the dummy address lines including dummy BLs and dummy WLs; at least one shorting structure extending across and in electrical contact with at least some of the dummy address lines to electrically short the at least some of the dummy address lines together; and at least one contact structure extending from the dummy array and electrically coupled to the at least some of the dummy address lines to connect the at least some of the dummy address lines to a predetermined voltage.

Example 2 includes the subject matter of Example 1, and optionally, wherein the at least some of the dummy address lines include all of the dummy BLs or all of the dummy WLs.

Example 3 includes the subject matter of Example 1, and optionally, wherein the at least one contact structure is a single contact structure.

Example 4 includes the subject matter of Example 3, and optionally, further including a substrate structure supporting the active memory array and the dummy array, the substrate structure including control circuitry therein, the control circuitry including one or more bias circuits, the at least one contact structure electrically coupled to the one or more bias circuits to connect the at least some of the dummy address lines to the predetermined voltage.

Example 5 includes the subject matter of Example 4, and optionally, wherein the one or more bias circuits include a single bias circuit and wherein the predetermined voltage corresponds to ground.

Example 6 includes the subject matter of Example 1, and optionally, wherein the at least one shorting structure includes a plurality of shorting structures, the at least some of the dummy address lines includes a plurality of clusters of dummy address lines, and each of the plurality of shorting structures extends across and is in contact with a corresponding one of the plurality of clusters of dummy address lines to electrically short the corresponding one of the plurality of clusters of address lines together.

Example 7 includes the subject matter of Example 6, and optionally, wherein the plurality of shorting structures include a plurality of array vias, the memory device including a dielectric layer over the at least some of the dummy address lines, the plurality of array vias being formed by way of a photolithographic process, an etch of the dielectric layer to form array via recesses therein, and a filling of the recesses with a conductive material.

Example 8 includes the subject matter of Example 7, and optionally, wherein the plurality of array vias form a daisy-chain shorting pattern to electrically short successive ones of the clusters of dummy address lines together.

Example 9 includes the subject matter of Example 6, and optionally, wherein each of the plurality of clusters includes X address lines, wherein X is between 2 and a maximum number corresponding to all of the dummy BLs or all of the dummy WLs.

Example 10 includes the subject matter of Example 1, and optionally, wherein the at least one shorting structure includes at least one conductive line formed by way of a photolithographic process distinct from an array via photolithographic process.

Example 11 includes the subject matter of Example 10, and optionally, wherein said at least some of the dummy address lines includes all of the dummy BLs or all of the dummy WLs.

Example 12 includes a method for making a memory device including: forming a memory array comprising: forming an active memory array including forming memory cells and address lines, the address lines including bitlines (BLs) and wordlines (WLs), each of the memory cells connected between one of the BLs and one of the WLs; and forming, during forming the address lines, a dummy array including dummy address lines, the dummy address lines including dummy BLs and dummy WLs; forming at least one shorting structure extending across and in electrical contact with at least some of the dummy address lines to electrically short the at least some of the dummy address lines together; and forming at least one contact structure extending from the dummy array and electrically coupled to the at least some of the dummy address lines to connect the at least some of the dummy address lines to a predetermined voltage.

Example 13 includes the subject matter of Example 12, and optionally, wherein the at least some of the dummy address lines include all of the dummy BLs or all of the dummy WLs.

Example 14 includes the subject matter of Example 12, and optionally, wherein the at least one contact structure is a single contact structure.

Example 15 includes the subject matter of Example 14, and optionally, further including: forming the memory array on a substrate structure, the substrate structure including control circuitry therein, the control circuitry including one or more bias circuits; and electrically coupling the at least one contact structure to the one or more bias circuits to connect the at least some of the dummy address lines to a predetermined voltage.

Example 16 includes the subject matter of Example 15, and optionally, wherein the one or more bias circuits include a single bias circuit.

Example 17 includes the subject matter of Example 12, and optionally, wherein the at least one shorting structure includes a plurality of shorting structures, the at least some of the dummy address lines includes a plurality of clusters of dummy address lines, and forming the plurality of shorting structures including forming the plurality of shorting structures such that each of the plurality of shorting structures extends across and is in contact with a corresponding one of the plurality of clusters of dummy address lines to electrically short the corresponding one of the plurality of clusters of address lines together.

Example 18 includes the subject matter of Example 17, and optionally, wherein the plurality of shorting structures include a plurality of array vias, and wherein forming the plurality of shorting structures includes: providing a dielectric layer over the at least some of the dummy address lines; using a photolithography and etch process to form array via recesses in the dielectric layer; and filling the recesses with a conductive material; and polishing the conductive material to obtain the plurality of array vias.

Example 19 includes the subject matter of Example 18, and optionally, wherein forming the plurality of array vias includes forming the plurality of array vias at a same time as forming array vias of the active memory array.

Example 20 includes the subject matter of Example 18, and optionally, wherein forming the plurality of shorting structures includes forming the plurality of array vias such that they form a daisy-chain shorting pattern to electrically short successive ones of the clusters of dummy address lines together.

Example 21 includes the subject matter of Example 17, and optionally, wherein each of the plurality of clusters includes X address lines, wherein X is between 2 and a maximum number corresponding to all of the dummy BLs or all of the dummy WLs.

Example 22 includes the subject matter of Example 12, and optionally, wherein forming the at least one shorting structure includes forming at least one conductive line using a photolithographic process distinct from an array via photolithographic process using to form array vias of the active memory array.

Example 23 includes the subject matter of Example 22, and optionally, wherein forming the at least one conductive line includes forming the at least one conductive line in a same manner as forming the address lines, and prior to forming array vias of the active memory array.

Example 24 includes the subject matter of Example 22, and optionally, wherein said at least some of the dummy address lines includes all of the dummy BLs or all of the dummy WLs.

Example 25 includes a system including: a substrate structure including a plurality of control circuitry therein, the control circuitry including one or more bias circuits; and a three-dimensional stack of memory arrays disposed on the substrate structure, each of the memory arrays including: an active memory array disposed on the substrate structure and including memory cells and address lines, the address lines including bitlines (BLs) and wordlines (WLs), each of the memory cells connected between one of the BLs and one of the WLs; a dummy array including dummy address lines, the dummy address lines including dummy BLs and dummy WLs; at least one shorting structure extending across and in electrical contact with at least some of the dummy address lines to electrically short the at least some of the dummy address lines together; and at least one contact structure extending from the dummy array and electrically coupled to the at least some of the dummy address lines to connect the at least some of the dummy address lines to the one or more bias circuits, the one or more bias circuits to supply a predetermined voltage.

Example 26 includes the subject matter of Example 25, and optionally, wherein the at least some of the dummy address lines include all of the dummy BLs or all of the dummy WLs.

Example 27 includes the subject matter of Example 25, and optionally, wherein the at least one contact structure is a single contact structure.

Example 28 includes the subject matter of Example 27, and optionally, wherein the predetermined voltage corresponds to ground.

Example 29 includes the subject matter of Example 28, and optionally, wherein the one or more bias circuits include a single bias circuit.

Example 30 includes the subject matter of Example 25, and optionally, wherein the at least one shorting structure includes a plurality of shorting structures, the at least some of the dummy address lines includes a plurality of clusters of dummy address lines, and each of the plurality of shorting structures extends across and is in contact with a corresponding one of the plurality of clusters of dummy address lines to electrically short the corresponding one of the plurality of clusters of address lines together.

Example 31 includes the subject matter of Example 30, and optionally, wherein the plurality of shorting structures include a plurality of array vias, the stack including a dielectric layer over the at least some of the dummy address lines, the plurality of array vias being formed by way of a photolithographic process, an etch of the dielectric layer to form array via recesses therein, and a filling of the recesses with a conductive material.

Example 32 includes the subject matter of Example 31, and optionally, wherein the plurality of array vias form a daisy-chain shorting pattern to electrically short successive ones of the clusters of dummy address lines together.

Example 33 includes the subject matter of Example 30, and optionally, wherein each of the plurality of clusters includes X address lines, wherein X is between 2 and a maximum number corresponding to all of the dummy BLs or all of the dummy WLs.

Example 34 includes the subject matter of Example 25, and optionally, wherein the at least one shorting structure includes at least one conductive line formed by way of a photolithographic process distinct from an array via photolithographic process.

Example 35 includes the subject matter of Example 34, and optionally, wherein said at least some of the dummy address lines includes all of the dummy BLs or all of the dummy WLs.

Example 36 includes the subject matter of Example 25, and optionally, further including a memory chip, the memory chip including the active memory array and a static random access memory (SRAM) coupled to the active memory array.

Example 37 includes the subject matter of Example 36, and optionally, further including a CPU coupled to the memory chip to communicate control signals thereto by way of the control circuitry of the substrate structure.

Example 38 includes an device comprising: one or more processors and one or more computer-readable media comprising instructions that, when executed by the one or more processors, cause the one or more processors to perform the method, techniques, or process as described in or related to any of the Examples above, or portions thereof.

Example 39 includes a signal as described in or related to any of the Examples above, or portions or parts thereof.

Example 40 includes a datagram, packet, frame, segment, protocol data unit (PDU), or message as described in or related to any of the Examples above, or portions or parts thereof, or otherwise described in the present disclosure.

Example 41 includes a signal encoded with data as described in or related to any of the Examples above, or portions or parts thereof, or otherwise described in the present disclosure.

Example 42 includes a signal encoded with a datagram, packet, frame, segment, protocol data unit (PDU), or message as described in or related to any of the Examples above, or portions or parts thereof, or otherwise described in the present disclosure.

Example 43 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 44 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A memory device including:
   an active memory array including memory cells and address lines, the address lines including bitlines (BLs) and wordlines (WLs), each of the memory cells connected between one of the BLs and one of the WLs;
   a dummy array including dummy address lines, the dummy address lines including dummy BLs and dummy WLs;
   at least one shorting structure extending across and in electrical contact with at least some of the dummy address lines to electrically short the at least some of the dummy address lines together; and
   at least one contact structure extending from the dummy array and electrically coupled to the at least some of the dummy address lines to connect the at least some of the dummy address lines to a predetermined voltage.

2. The memory device of claim 1, wherein the at least some of the dummy address lines include all of the dummy BLs or all of the dummy WLs.

3. The memory device of claim 1, wherein the at least one contact structure is a single contact structure and the predetermined voltage corresponds to ground.

4. The memory device of claim 3, further including a substrate structure supporting the active memory array and the dummy array, the substrate structure including control circuitry therein, the control circuitry including one or more bias circuits, the at least one contact structure electrically coupled to the one or more bias circuits to connect the at least some of the dummy address lines to the predetermined voltage.

5. The memory device of claim 4, wherein the one or more bias circuits include a single bias circuit.

6. The memory device of claim 1, wherein the at least one shorting structure includes a plurality of shorting structures, the at least some of the dummy address lines includes a plurality of clusters of dummy address lines, and each of the plurality of shorting structures extends across and is in contact with a corresponding one of the plurality of clusters of dummy address lines to electrically short the corresponding one of the plurality of clusters of dummy address lines together.

7. The memory device of claim 6, wherein the plurality of shorting structures include a plurality of array vias, the memory device including a dielectric layer over the at least some of the dummy address lines, the plurality of array vias being formed by way of a photolithographic process, an etch of the dielectric layer to form array via recesses therein, and a filling of the recesses with a conductive material.

8. The memory device of claim 7, wherein the plurality of array vias form a daisy-chain shorting pattern to electrically short successive ones of the clusters of dummy address lines together.

9. The memory device of claim 1, wherein the at least one shorting structure includes at least one conductive line formed by way of a photolithographic process distinct from an array via photolithographic process.

10. A method for making a memory device including:
forming a memory array comprising:
forming an active memory array including forming memory cells and address lines, the address lines including bitlines (BLs) and wordlines (WLs), each of the memory cells connected between one of the BLs and one of the WLs; and
forming, during forming the address lines, a dummy array including dummy address lines, the dummy address lines including dummy BLs and dummy WLs;
forming at least one shorting structure extending across and in electrical contact with at least some of the dummy address lines to electrically short the at least some of the dummy address lines together; and
forming at least one contact structure extending from the dummy array and electrically coupled to the at least some of the dummy address lines to connect the at least some of the dummy address lines to a predetermined voltage.

11. The method of claim 10, wherein the at least one shorting structure includes a plurality of shorting structures, the at least some of the dummy address lines includes a plurality of clusters of dummy address lines, and forming the plurality of shorting structures including forming the plurality of shorting structures such that each of the plurality of shorting structures extends across and is in contact with a corresponding one of the plurality of clusters of dummy address lines to electrically short the corresponding one of the plurality of clusters of dummy address lines together.

12. The method of claim 11, wherein the plurality of shorting structures include a plurality of array vias, and wherein forming the plurality of shorting structures includes:
providing a dielectric layer over the at least some of the dummy address lines;
using a photolithography and etch process to form array via recesses in the dielectric layer; and
filling the recesses with a conductive material; and
polishing the conductive material to obtain the plurality of array vias.

13. The method of claim 12, wherein forming the plurality of array vias includes forming the plurality of array vias at a same time as forming array vias of the active memory array.

14. The method of claim 11, wherein forming the at least one shorting structure includes forming at least one conductive line using a photolithographic process distinct from an array via photolithographic process using to form array vias of the active memory array.

15. A system including:
a substrate structure including a plurality of control circuitry therein, the control circuitry including one or more bias circuits; and
a three-dimensional stack of memory arrays disposed on the substrate structure, each of the memory arrays including:
an active memory array disposed on the substrate structure and including memory cells and address lines, the address lines including bitlines (BLs) and wordlines (WLs), each of the memory cells connected between one of the BLs and one of the WLs;
a dummy array including dummy address lines, the dummy address lines including dummy BLs and dummy WLs;
at least one shorting structure extending across and in electrical contact with at least some of the dummy address lines to electrically short the at least some of the dummy address lines together; and
at least one contact structure extending from the dummy array and electrically coupled to the at least some of the dummy address lines to connect the at least some of the dummy address lines to the one or more bias circuits, the one or more bias circuits to supply a predetermined voltage.

16. The system of claim 15, wherein the at least some of the dummy address lines include all of the dummy BLs or all of the dummy WLs.

17. The system of claim 15, wherein the at least one contact structure is a single contact structure.

18. The system of claim 15, wherein the at least one shorting structure includes a plurality of shorting structures, the at least some of the dummy address lines includes a plurality of clusters of dummy address lines, and each of the plurality of shorting structures extends across and is in contact with a corresponding one of the plurality of clusters of dummy address lines to electrically short the corresponding one of the plurality of clusters of dummy address lines together.

19. The system of claim 15, wherein the one or more bias circuits include a single bias circuit.

* * * * *